July 23, 1963 D. M. LEAKEY 3,098,976
LOW CROSS-TALK DELAY CIRCUIT
Filed Sept. 15, 1960 2 Sheets-Sheet 1

3,098,976
Patented July 23, 1963

3,098,976

LOW CROSS-TALK DELAY CIRCUIT

David M. Leakey, Eastcote, Ruislip, England, assignor to The General Electric Co., Ltd.
Filed Sept. 15, 1960, Ser. No. 56,180
Claims priority, application Great Britain Oct. 8, 1959
9 Claims. (Cl. 328—55)

Figure 1:
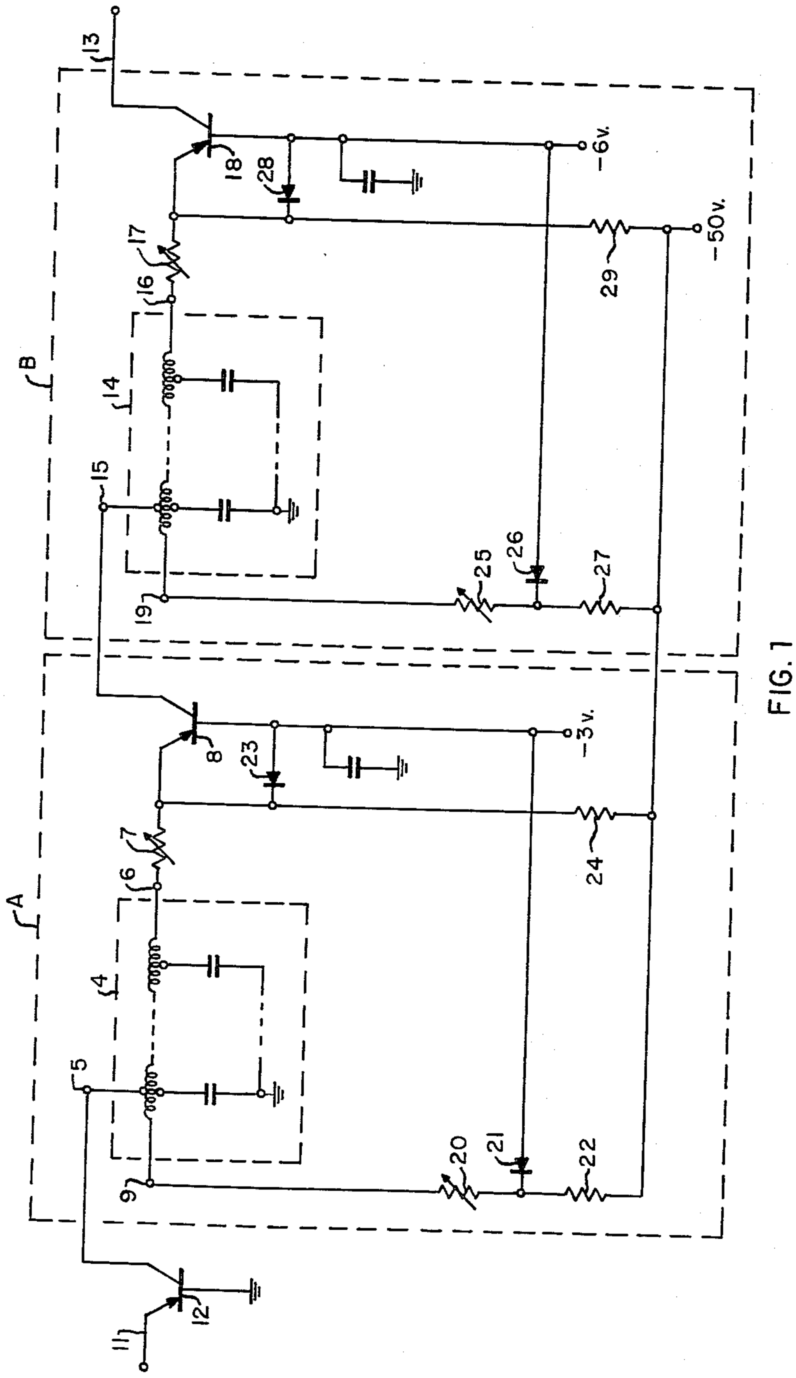

This invention relates to pulse delay circuits and more particularly to pulse delay circuits of the kind having a delay time equal to a multiple of one-half the pulse recurrence period of an input pulse train. That is, where it is arranged that the pulses of a pulse train are delayed by a time T equal to ½ $(n \cdot t)$, where $n$ is any integer and $t$ is the pulse recurrence period of the pulse train.

In general, delay in the pulses of a pulse train may be obtained conveniently by applying those pulses to the input of a delay line that has a delay time equal to the required time delay for those pulses. However, the pulses which are applied to the input give rise to reflections at the output of the delay line for passage through that line, and this is of particular importance in circuits of the kind specified. The reason for this is that with a delay line having a delay time equal to T, the time between the application of a pulse to the input of the delay line and the arrival at that input of the first reflection of that pulse from the output of the delay line, that is a time 2T, is equal to the pulse recurrence period $t$ of the pulse train, or some integral multiple thereof. Thus, in a circuit of the kind specified, the first reflection of a pulse arrives at the input of the delay line concurrently with the application to that input of a later pulse of the pulse train, and this results in undesirable interference with the pulses of the pulse train in their transmission through the delay line. This undesirable interference is referred to as cross-talk in this specification.

It is an object of the present invention to provide a low cross-talk delay circuit of the kind specified which overcomes one or more disadvantages of the prior art.

It is an additional object of this invention to provide a pulse delay circuit in which interference between the various pulses of a pulse train is avoided.

According to the invention, a low cross-talk delay circuit, adapted to delay a pulse train for a period such that reflections of pulses in the delay circuit tend to interact with later pulses of the pulse train, comprises a plurality of delay stages connected in cascade, the overall delay time of the cascaded stages being equal to the aforementioned period, each stage including a delay line having an input to which the pulses to be delayed are applied and means for responding to pulses delayed by the delay line to pass them to an output of the stage but not responding to reflections of these pulses in the line; and the delay line of each stage having a delay time such that the appearance at the input of the first reflection of any pulse within that delay line is not concurrent with the application to that input of another later pulse of the pulse train.

For a better understanding of the present invention, together with other and further objects thereof, reference is had to the following description taken in connection with the accompanying drawings, and its scope will be pointed out in the appended claims.

Figure 2:
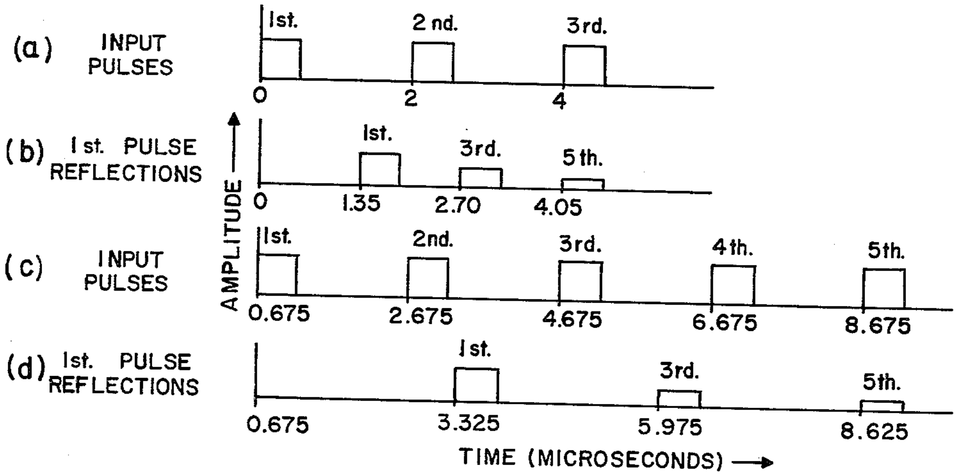
Figure 3:
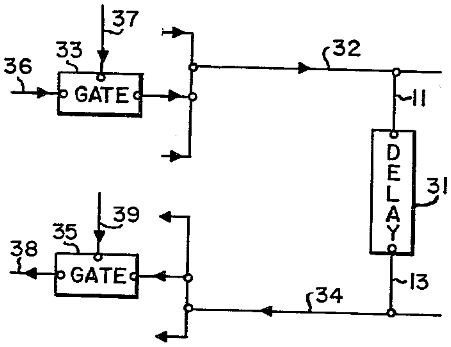

In the drawings:

FIG. 1 is a circuit diagram of part of the pulse circuit;

FIGS. 2($a$) to ($d$) are diagrammatic representations of the timings of pulses and reflections within delay lines in the circuit of FIG. 1, and FIG. 3 is a block schematic diagram of part of a telephone exchange including the pulse circuit.

In describing the illustrated example of a low cross-talk delay circuit it will be helpful to have in mind practical values of recurrence periods and delay times which might be used. Thus, the pulses of a pulse train having a pulse recurrence period of two microseconds are delayed by two microseconds, in this example, and FIG. 1 shows only that part of the complete circuit which effects this delay. It will be appreciated that for the described pulse train, a delay for a period of two microseconds is such that reflections of pulses in known types of delay circuits would tend to interact strongly with later pulses of the train.

Referring to FIG. 1, the train of pulses to be delayed is supplied to an input lead 11. These pulses each have a duration of 0.5 microsecond and are applied, over the lead 11, to the emitter electrode of a PNP junction transistor 12. The base electrode of the transistor 12 is connected directly to ground and its collector electrode is connected to a delay stage A. The delay circuit as illustrated comprises a plurality of delay stages of which stage A is the first of two delay stages A and B that are connected in cascade between the transistor 12 and an output lead 13 of the circuit. The stages A and B together provide an over-all delay of two microseconds for the pulses applied over the lead 11, the delay time of the stage A being 0.675 microsecond and that of the stage B being 1.325 microseconds.

The delay stage A includes a delay line 4 having a delay time of 0.675 microsecond, and the collector electrode of the transistor 12 is connected directly to input means for supplying a pulse train shown as an input terminal 5 of this delay line. A pulse of collector current flows in the transistor 12, and therefore in the delay line 4, in response to each of the pulses applied over the input lead 11, but the transistor 12 is otherwise nonconducting. The pulses in this manner applied to the delay line 4 appear at an output terminal 6 of the delay line after the time delay of 0.675 microsecond.

The delayed pulses appearing at the output terminal 6 are applied through a variable resistor 7 to the emitter electrode of a PNP junction transistor 8. The base electrode of the transistor 8 is connected to a three volt negative bias source, and this transistor, which is normally nonconducting, conducts in response to each of the delayed pulses applied to its emitter electrode from the output terminal 6.

The pulses of collector current which flow in the transistor 8 are applied to the delay stage B to be delayed by a delay line 14 in that stage. The collector electrode of the transistor 8 is in fact connected directly to an input terminal 15 of the delay line 14, and the pulses applied to this terminal appear at an output terminal 16 of that delay line after the time delay of 1.325 microseconds.

The delayed pulses appearing at the output terminal 16 are applied through a variable resistor 17 to the emitter electrode of a PNP junction transistor 18. The base electrode of the transistor 18 is connected to a six volt negative bias source, and this transistor, which is normally nonconducting, conducts in response to each delayed pulse applied to its emitter electrode from the output terminal 16.

The output lead 13 of the delay circuit is connected directly to the collector electrode of the transistor 18 so that the pulses of collector current which flow in that transistor as a result of the pulses appearing at the terminal 16 also flow in that lead. These collector current pulses flow in the lead 13 two microseconds after the flow of the corresponding pulses in the lead 11, the delay lines 4 and 14 delaying the pulses applied over the lead 11 by successive periods of 0.675 and 1.325 microseconds.

The delay lines 4 and 14 comprise respectively twenty-seven and fifty-three center-tapped $m$-derived filter sections (of which only the first and last is shown in both cases). These delay lines have respective input terminals 9 and 19 additional to the input terminals 5 and 15, and these two additional terminals 9 and 19 are connected directly to the input ends of the respective first filter sections. The terminals 5 and 15 on the other hand are connected directly to the center taps of those sections, and this fact serves to reduce the effect of the capacitive loading upon the lines 4 and 14 which is due to the base-to-collector capacitances of the transistors 8 and 18 respectively.

Referring to terminal 9, there is connected thereto an amplitude sensitive termination including a terminating impedance made up of variable resistor 20 and resistor 22 and means responsive to a signal having at least a predetermined amplitude shown as rectifier 21.

Variable resistor 20 is connected at one end to the terminal 9 of the delay line 4 and at the other end to the junction of rectifier 21 and resistor 22. The rectifier 21 and the resistor 22 are connected respectively to three and fifty volt negative bias sources so that in normal circumstances the rectifier 21 conducts with the result that there is a low resistance path to ground at the junction of the two resistors 20 and 22, effectively shorting out the portion of the terminating impedance shown as resistor 22.

In a similar manner the output terminal 6 of the delay line 4 has connected thereto a termination including a terminating impedance made up of variable resistor 7 and resistor 24, means responsive to a signal having at least a predetermined amplitude shown as rectifier 23 and an electronic valve illustrated as transistor 8. Terminal 6 is connected, through the variable resistor 7, to the junction of a rectifier 23 and a resistor 24, the rectifier 23 and the resistor 24 being connected (as in the case of the rectifier 21 and the resistor 22) between respective three and fifty volt negative bias sources. The rectifier 23 is normally conducting so that in these circumstances there is a low resistance path to ground at the junction of the two resistors 7 and 24, effectively shorting out the portion of the terminating impedance shown as resistor 24.

To the input and output terminals 19 and 16 of the delay line 14 are connected additional amplitude-sensitive terminations. Thus, terminal 19 connects through a variable resistor 25 to the junction of a rectifier 26 and a resistor 27, and the output terminal 16 of that delay line is connected, through the variable resistor 17, to the junction of a rectifier 28 and a resistor 29. The resistors 25, 27 and 29 together with the rectifiers 26 and 28 in the stage B are arranged in the same manner as the corresponding resistors 20, 22 and 24 and rectifiers 21 and 23 in the stage A except that the rectifiers 26 and 28 are connected to six volt negative bias sources rather than to three volt sources.

In operation, each pulse applied to the transistor 12 over the lead 11 causes collector current to flow through the resistor 20 to render the rectifier 21 nonconducting, changing the effective impedance from the relatively low impedance presented by resistor 20 to a higher impedance as presented by resistors 20 and 22 in series. This current flows in the resistor 20 for the duration of the pulse so that during this pulse the resistance to ground at the junction of the rectifier 21 and the resistor 22 has a high value. In consequence, a high proportion (for example ninety-five percent) of the collector current flowing in the transistor 12 flows in the delay line 4 to result in the appearance of a pulse, 0.675 microsecond later, at the output terminal 6.

The current which flows through the resistor 7 on the appearance of the delayed pulse at the terminal 6 causes the rectifier 23 to become nonconducting for the duration of that pulse. In these circumstances, therefore, a high proportion of the current flowing through the resistor 7 flows into the transistor 8 to result in the application of that pulse to the stage B.

The resistance of the resistor 7 is set so that during the delayed pulse at the terminal 6, the resistance to ground from that terminal is substantially equal to the characteristic impedance of the delay line 4 in order that the output of this delay line shall be properly terminated at this time.

Any reflection from the output of the delay line 4 as a result of the pulse applied to the transistor 8, passes back along that line to its input to arrive at the input terminals 5 and 9 some 1.35 microseconds after the application of the pulse over the lead 11. At this time the transistor 12 is nonconducting so that there is a high impedance between the terminal 5 and ground through that transistor. On the other hand, the resistance to ground at the terminal 9 is low, being, in fact, substantially solely due to the resistor 20, since the rectifier 21 is conducting at this time.

It is arranged, by adopting a suitable setting of the resistor 7, that any reflection arriving at the input of the delay line 4 from the output of that line is either of a magnitude insufficient to cause the rectifier 21 to cease conducting or of the opposite sense so as to increase its conduction. In addition, the variable resistor 20 is set so that as far as reflections are concerned, the resistance between the terminal 9 and ground is substantially equal to the characteristic impedance of the line 4. There is, therefore, a good termination at the input of the line for the first reflection. It will now be seen that this termination is efficient to change the effective impedance from a relatively low impedance to a higher impedance when signals having a predetermined amplitude are present.

Any reflection from the input of the delay line 4, for example a second reflection resulting from the first reflection, passes along that delay line to appear at the output terminal 6. On the appearance of this second reflection at the terminal 6, the rectifier 23 is conducting and it is arranged that this condition remains unchanged by that reflection. The transistor 8 remains nonconducting responding only to signals having a predetermined amplitude so that the reflection is not passed from the stage A to the stage B, but since the rectifier 23 is conducting there is a low resistance path to ground from the terminal 6 for this reflection. The resistance of this path being substantially solely due to the resistor 7, is substantially equal to the characteristic impedance of the delay line 4 so that there is a good termination at the output of the line for the second reflection.

The third and fourth reflections which may result from the arrival of the second reflection at the output of the delay line 4 pass along that line in a similar manner to the first and second reflections respectively. The third reflection arrives at the input of the delay line 4 to be met by the good termination provided substantially solely by the resistor 20. No pulse is applied to the input terminal 5 from the transistor 12 during the arrival of the third reflection at the input of the delay line. The fourth reflection on arrival at the output of that line is met by the good termination provided substantially solely by the resistor 7, and the transistor 8 remains nonconducting at this time. The fourth reflection, like the second reflection, is therefore not passed to the delay stage B.

Up till now only one other pulse has been applied to the transistor 12 from the lead 11, this pulse being applied to the input terminal 5 between the arrival of the first and third reflections at the input. This other pulse passes along the delay line 4 to the stage B in the same manner as the first pulse and is substantially unaffected by the reflections in that line. The next pulse, that is the third, applied to the transistor 12 is applied to the input terminal 5 concurrently with the arrival at the input of the delay line of the fifth reflection of the first pulse. Owing to the application of the third pulse the rectifier 21 ceases to conduct so that the input of the delay line is then improperly terminated for the fifth reflection. A large proportion of this fifth reflection (as the sixth reflection of the first pulse) is therefore transmitted along the delay line 4 with the third pulse. Since the third pulse is passed to the delay stage B in the same manner as the first and second pulses, the sixth reflection also passes to that stage. It will be appreciated, however, that the magnitude of the sixth reflection passed to the delay stage B is very small since five of the six reflections originate from good terminations of the delay line 4, and there has then been six traversals of that line since the first reflection.

The time patterns of the above-mentioned pulses and reflections appearing at the input of the delay line 4, and the time pattern of those pulses as applied to the input of the delay line 14 in the stage B, are shown in FIGS. 2(*a*), 2(*b*), and 2(*c*), respectively, the time scales in these three figures being taken from the time of application of the first pulse to the input of the delay line 4. In FIG. 2, the relative signal amplitudes are distorted for clarity, the pulses actually being greatly attenuated by sucessive reflections as described.

The operation of the delay stage B in response to the pulses applied from the stage A to the input terminal 15 of the delay line 14, is similar to that of stage A in response to the pulses applied to the input terminal 5. In this case however, the delay of the delay line is 1.325 microseconds instead of 0.675 microsecond. The time pattern of the reflections of the first pulse as these appear at the input of the delay line 14 is shown in FIG. 2(*d*), the same time scale being used in this figure as in FIGS. 2(*a*), 2(*b*), and 2(*c*).

From FIG. 2(*d*) it will be appreciated that the only reflection of the first pulse within the delay line 14, to be passed through the transistor 18 to the output lead 13 is again the sixth reflection of that pulse. However, it should be observed that this sixth reflection passes to the output lead 13 with the fifth pulse, whereas the sixth reflection of the first pulse within the delay line 4 passes to this output lead 13, after passage through the delay line 14, with the third pulse. This is due to the fact that the delay lines 4 and 14 have different delay times, and has the effect that those reflections of the two delay lines 4 and 14 which do pass to the output lead 13 cannot augment one another.

The arrangement described above with reference to FIG. 1 may find application in an automatic telephone exchange using the time division multiplex system of communication between subscribers. To illustrate this application reference will now be made to FIG. 3 in which the arrangement shown in FIG. 1 has been given the general reference "31."

Referring to FIG. 3, the input lead 11 of the delay arrangement 31 is connected to receive amplitude-modulated pulses from a common multiplex pulse transmission highway 32. The pulses each have a duration of 0.5 microsecond and are applied to the highway 32 from a plurality of gate 33 (of which only one is shown). The pulses applied from the gates 33 are interlaced in time to form thereby a train of pulses having a pulse recurrence period of two microseconds.

This train of pulses is delayed by the delay arrangement 31 and the delayed pulses appearing on the output lead 13 are passed over another common multiplex pulse transmission highway 34 to be received by a plurality of gates 35 (of which only one is shown).

During the setting-up of a call between a pair of subscribers connected to the exchange a first of those subscribers is individually allotted one of the gates 33 and the second is individually allotted one of the gates 35. In the subsequent call the speech signals from the first subscriber are applied to his allotted gate 33 over a lead 36 which is individual to that particular gate. A train of gating pulses is applied to this gate 33 over an individual lead 37 so that pulses of current in the time positions of the gating pulses and amplitude modulated by the speech signals are applied from that gate 33 to the highway 32.

After delay by the delay arrangement 31, the amplitude-modulated pulses are applied to the highway 34 and thence to the gates 35. It is arranged that a train of suitably timed gating pulses is applied to that one of the gates 35 which has been allotted to the second subscriber in order that these amplitude-modulated pulses shall be passed by that gate to an individual output lead 38. The gating pulses are applied to the gate 35 over an individual lead 39, and the modulated pulses passed by this gate are thereafter demodulated to regain the speech signals originally applied to the lead 36, for reception by the second subscriber.

Speech signals are similarly transmitted between other pairs of subscribers, the different pairs of subscribers being allotted different pairs of the gates 33 and 35. The timings of the gating pulses applied to those gates are such that the amplitude-modulated pulses from the different gates 33 are interlaced in time and only the appropriate amplitude-modulated pulses are passed by the respective gates 35.

If the delay arrangement 31 was formed by a single delay line having a delay time of two microseconds, instead of as shown in FIG. 1, the second reflection of each amplitude-modulated pulse within that delay line would be transmitted with the pulse that occurs four microseconds later on the highway 32. In these circumstances there is cross-talk between the calls. Two reflections only are involved and, if as is usual, an over-all cross-talk ratio of better than −80 decibels is required, it is necessary to have terminations at both ends of the delay line which are matched to the characteristic impedance of that line to an accuracy of about one percent. This strict requirement is extremely difficult to achieve.

The above difficulty is overcome with the delay circuit shown in FIG. 1 by arranging that the over-all delay is provided by the two delay stages A and B which are in effect interconnected only during the pulses. In these circumstances the only important reflections which contribute to cross-talk are those resulting from six reflections within either of the two stages, and this has the result that terminations having reflection coefficients of −14 decibels are all that is required. This assumes that matched terminations are permanently connected at both ends of the two delay lines, however, with this there is the disadvantage that the resulting dissipation of the energy of the pulses themselves in those terminations involves a loss of some six decibels per delay line in the delay circuit. With the actual arrangement of FIG. 1, however, this disadvantage is also overcome since the matched terminations are effective only in the intervals between pulses.

In one delay circuit constructed as shown in FIG. 1, the delay lines 4 and 14 both have a characteristic impedance of one-hundred and twenty ohms. Since in this case the relevant input impedances of the transistors 8 and 18 is some forty ohms, the values of the resistors 7 and 17 are required to be appreciably smaller than the characteristic impedances of their respective lines. In these circumstances, it is apparent that it may be desirable to use delay lines having larger characteristic impedances so that the input impedances of the transistors shall be proportionately smaller. In the present case, a value of about two-hundred and fifty ohms appears to be optimum, but in these circumstances it would be necessary to double the bias voltages applied to the rectifiers 21, 23, 26 and 28 and to the base electrodes of the transistors 8 and 18.

While there has been described what is at present considered to be the preferred embodiment of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A low cross-talk delay circuit adapted to delay a pulse train for a period such that reflections of pulses in said delay circuit tend to interact with later pulses of said train, comprising: a plurality of delay stages connected in cascade, the over-all delay time of the cascaded stages being equal to said period; each stage including a delay line having an input to which the pulses to be delayed are applied and means for responding to pulses delayed by said line to pass them to an output of the stage but not responding to reflections of said pulses in said line; and the delay line of each stage having a delay time such that the appearance at the input of the first reflection of any pulse within that delay line is not concurrent with the application to that input of another later pulse of the pulse train.

2. A low cross-talk delay circuit adapted to delay a pulse train for a period such that reflections of pulses in said delay circuit tend to interact with later pulses of said train, comprising: a plurality of delay stages connected in cascade, the over-all delay time of the cascaded stages being equal to said period; each stage including a delay line having an input to which the pulses to be delayed are applied and said delay line having at least one termination including a terminating impedance and a normally conductive rectifier arranged to change its state of conduction in response to a pulse having at least a predetermined amplitude, thereby changing the effective impedance from a relatively low impedance to a higher impedance when said pulses are present; and the delay line of each stage having a delay time such that the appearance at the input of the first reflection of any pulse within that delay line is not concurrent with the application to that input of another later pulse of the pulse train.

3. A low cross-talk delay circuit adapted to delay a pulse train for a period such that reflections of pulses in said delay circuit tend to interact with later pulses of said train, comprising: a plurality of delay stages connected in cascade, the over-all delay time of the cascaded stages being equal to said period; each stage including a delay line having an input to which the pulses to be delayed are applied and said delay line having at least one termination including a terminating impedance effectively in two sections, one of which approximates the characteristic impedance of said delay line, a normally conductive rectifier which effectively shorts out the other section of said terminating impedance but which becomes nonconductive in response to a pulse having at least a predetermined amplitude, thereby presenting a terminating impedance greater than said characteristic impedance to such pulses; and the delay line of each stage having a delay time such that the appearance at the input of the first reflection of any pulse within that delay line is not concurrent with the application to that input of another later pulse of the pulse train.

4. A low cross-talk delay circuit adapted to delay a pulse train for a period such that reflections of pulses in said delay circuit tend to interact with later pulses of said train, comprising: a plurality of delay stages connected in cascade, the over-all delay time of the cascaded stages being equal to said period; each stage including a delay line having an input to which the pulses to be delayed are applied and said delay line having at least one termination including a terminating impedance, a normally conductive rectifier arranged to change its state of conduction in response to a pulse having at least a predetermined amplitude, thereby changing the effective impedance from a relatively low impedance to a higher impedance when said pulses are present, and an electronic valve coupled to said rectifier which responds only to said pulses, thereby rejecting pulses reflected in said delay line; and the delay line of each stage having a delay time such that the appearance at the input of the first reflection of any pulse within that delay line is not concurrent with the application to that input of another later pulse of the pulse train.

5. A low cross-talk delay circuit adapted to delay a pulse train for a period such that reflections of pulses in said delay circuit tend to interact with later pulses of said train, comprising: a plurality of delay stages connected in cascade, the over-all delay time of the cascaded stages being equal to said period; each stage including a delay line having an input to which the pulses to be delayed are applied and means for responding to pulses delayed by said line to pass them to an output of the stage but not responding to reflections of said pulses in said line, the delay line of each stage having a delay time such that the appearance at the input of the first reflection of any pulse within that delay line is not concurrent with the application to that input of another later pulse of the pulse train; and the individual stages of said plurality of stages having different delay times which are such that if a particular pulse of the pulse train is passed to the output of one particular stage after delay by that particular stage together with a reflection of an earlier pulse of the pulse train, this aforementioned particular pulse does not then appear at the output of the next stage after delay by that next stage wth a reflection of the same earlier pulse within the delay line of that next stage.

6. A low cross-talk delay circuit for delaying a pulse train comprising: a plurality of delay stages connected in cascade, the over-all delay time of the delay stages connected in cascade being equal to a multiple of one-half the pulse recurrence period, each stage comprising a delay line having an input to which the pulses to be delayed are applied and means for responding to pulses delayed by the delay line to pass them to an output of the stage but not to so respond to reflections of said pulses within that delay line; and the delay line of each stage having a delay time such that the appearance at the input of the first reflection of any pulse within that delay line is not concurrent with the application to that input of any later pulse of the pulse train.

7. A low cross-talk delay circuit for delaying a pulse train comprising: a plurality of delay stages connected in cascade, the over-all delay time of the delay stages connected in cascade being equal to a multiple of one-half the pulse recurrence period, each stage comprising a delay line having an input to which the pulses to be delayed are applied and means for responding to pulses delayed by the delay line to pass them to an output of the stage but not to so respond to reflections of said pulses within that delay line; and the delay line of each stage having a delay time such that the appearance at the input of the first reflection of any pulse within that delay line is not concurrent with the application to that input of any later pulse of the pulse train; the individual stages of said plurality of stages having different delay times which are such that if a particular pulse of the pulse train is passed to the output of one particular stage, after delay by that particular stage, together with a reflection of an earlier pulse of the pulse train, this aforementioned particular pulse does not then appear at the output of the next stage, after delay by that next stage, with a reflection of the same earlier pulse within the delay line of that next stage.

8. A low cross-talk delay circuit, whose over-all delay time is equal to a multiple of one-half the pulse recurrence period of an input pulse train, made up of a plurality of delay stages each comprising: input means for supplying a pulse train having predetermined pulse spacings; an input termination coupled to said input means including an input terminating impedance and a normally conductive rectifier which effectively shorts out a portion of said input terminating impedance but which becomes nonconductive in response to a signal having at least predetermined amplitude, thereby presenting substantially the complete input terminating impedance to such signals; a delay line coupled to said input termination having a delay such that the first reflection of a pulse in said line does not appear at the input concurrently with any later incoming pulse; and an output circuit including an output terminating impedance and a normally conductive rectifier which effectively shorts out a portion of said output terminating impedance, but which becomes nonconductive in response to a signal having at least a predetermined amplitude thereby presenting substantially the complete output terminating impedance to such signals, and an electronic valve coupled to said rectifier which responds only to said signals, thereby rejecting signals reflected in said delay line.

9. A low cross-talk delay circuit whose over-all delay time is equal to a multiple of one-half the pulse recurrence period of an input pulse train, made up of a plurality of delay stages having different delay times which are such that if a particular pulse of the pulse train is passed to the output of one particular stage, after delay by that stage, together with a reflection of an earlier pulse of the pulse train, this aforementioned particular pulse does not then appear at the output of the next stage, after delay by that next stage, with a reflection of the same earlier pulse within the delay line of that next stage, each stage comprising: input means for supplying a pulse train having predetermined pulse spacings; an input termination coupled to said input means including an input terminating impedance and a normally conductive rectifier which effectively shorts out a portion of said input terminating impedance but which becomes nonconductive in response to a signal having at least predetermined amplitude, thereby presenting substantially the complete input terminating impedance to such signals; a delay line coupled to said input termination having a delay such that the first reflection of a pulse in said line does not appear at the input concurrently with any later incoming pulse; and an output circuit including an output terminating impedance and a normally conductive rectifier which effectively shorts out a portion of said output terminating impedance, but which becomes nonconductive in response to a signal having at least a predetermined amplitude thereby presenting substantially the complete output terminating impedance to such signals, and an electronic valve coupled to said rectifier which responds only to said signals, thereby rejecting signals reflected in said delay line.

References Cited in the file of this patent

UNITED STATES PATENTS

| | | |
|---|---|---|
| 2,262,468 | Percival | Nov. 11, 1941 |
| 2,631,232 | Baracket | Mar. 10, 1953 |
| 2,923,898 | Goad | Feb. 2, 1960 |
| 2,939,085 | Foster | May 31, 1960 |